United States Patent
Lai

(10) Patent No.: US 9,899,997 B2
(45) Date of Patent: Feb. 20, 2018

(54) APPARATUS FOR SUPPLYING GATE DRIVING VOLTAGES, METHOD THEREFOR AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventor: Yiqiang Lai, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 185 days.

(21) Appl. No.: 14/375,356

(22) PCT Filed: Jul. 19, 2013

(86) PCT No.: PCT/CN2013/079714
§ 371 (c)(1),
(2) Date: Jul. 29, 2014

(87) PCT Pub. No.: WO2014/183336
PCT Pub. Date: Nov. 20, 2014

(65) Prior Publication Data
US 2015/0280700 A1    Oct. 1, 2015

(30) Foreign Application Priority Data
May 13, 2013   (CN) .......................... 2013 1 0175287

(51) Int. Cl.
*G09G 3/36*      (2006.01)
*H03K 17/0412*   (2006.01)
*H03K 17/0812*   (2006.01)

(52) U.S. Cl.
CPC ..... *H03K 17/04123* (2013.01); *G09G 3/3648* (2013.01); *G09G 3/3677* (2013.01);
(Continued)

(58) Field of Classification Search
CPC .................................................. G09G 3/3648
See application file for complete search history.

(56) References Cited

U.S. PATENT DOCUMENTS 8,456,404 B2 *  6/2013  Tonomura ............... H02M 3/07
                                                345/204
2007/0195920 A1  8/2007  Tobita
(Continued)

FOREIGN PATENT DOCUMENTS

| CN | 101026012 A | 8/2007 |
| CN | 101202022 A | 6/2008 |
| CN | 101339752 A | 1/2009 |

OTHER PUBLICATIONS

International Search Report Appln. No. PCT/CN2013/079714; dated Mar. 13, 2014.
(Continued)

*Primary Examiner* — Kent Chang
*Assistant Examiner* — Scott Au
(74) *Attorney, Agent, or Firm* — Ladas & Parry LLP

(57) ABSTRACT

There are provided an apparatus for supplying gate driving voltages, a method for supplying gate driving voltages and a display apparatus to which the apparatus for supplying gate driving voltages is applied to. In the apparatus for supplying gate driving voltages, there is disposed a starting voltage boost module connected with a starting voltage output module. The starting voltage boost module is configured to boost a second preset voltage to a third preset voltage higher than a first preset voltage in advance within a predetermined period of time when the second preset
(Continued)

voltage is restored to the first preset voltage. By means of the third preset voltage with a higher voltage, the time taken by a gate ON voltage to be restored to the first preset voltage from the second preset voltage is shortened, a response speed is quicken and a problem of too slow restoration due to a large load is settled, so that a charging time of a liquid crystal display panel is increased and the display quality of the picture is enhanced.

16 Claims, 3 Drawing Sheets

(52) U.S. Cl.
CPC ..... *G09G 3/3696* (2013.01); *H03K 17/08122* (2013.01); *G09G 2300/0871* (2013.01); *G09G 2320/0223* (2013.01); *G09G 2330/023* (2013.01)

(56) References Cited

U.S. PATENT DOCUMENTS

| | | | |
|---|---|---|---|
| 2008/0143697 A1* | 6/2008 | Kojima | G09G 3/3688 345/204 |
| 2009/0009498 A1 | 1/2009 | Nishimura | |
| 2010/0245326 A1* | 9/2010 | Xiao | G09G 3/3655 345/211 |
| 2012/0113161 A1* | 5/2012 | Hong | G09G 3/003 345/690 |

OTHER PUBLICATIONS

First Chinese Office Action Appln. No. 201310175287.7; dated Oct. 11, 2014.

International Preliinary Report on Patentability Appln. No. PCT/CN2013/079714; dated Nov. 17, 2015.

* cited by examiner

APPARATUS FOR SUPPLYING GATE DRIVING VOLTAGES, METHOD THEREFOR AND DISPLAY APPARATUS

TECHNICAL FIELD

The present disclosure relates to a field of display technique, and more particularly to an apparatus for supplying gate driving voltages, a method therefor and a display apparatus.

BACKGROUND

A Thin Film Transistor-Liquid Crystal Display (TFT-LCD) has been widely applied to an electronic product such as a TV, a mobile phone, a display, etc, and occupied a dominant position in a tablet panel display field, since it is advantageous in that it can provide stable pictures and lively images, eliminate radicalizations, save space and power consumption, and the like.

In order to control a switching of the thin film transistor, in general, an apparatus for supplying gate driving voltages supplies a gate ON voltage $V_{ON}$ to a gate driving integrated circuit, the gate ON voltage $V_{ON}$ is generally between 18 V-30 V and its exact voltage value depends on a specific design of the thin film transistor. A Multi Level Gate (MLG) driving technique is usually utilized to reduce a picture flicker, that is, the gate ON voltage $V_{ON}$ is processed by a Multi Level Gate driving integrated circuit (MLG IC). In particular, as shown in FIG. 1: at a specific time, a first preset voltage $V_{GH}$ would drop to a second preset voltage $V_{GH}'$, wherein the second preset voltage $V_{GH}'$ is lower than first preset voltage $V_{GH}$ but would not cause the thin film transistor to be turned off yet, so that a chamfered angle might appear in an output waveform of the gate driving integrated circuit, as illustrated in FIG. 2. There is a certain restoration time when the second preset voltage $V_{GH}'$ is to be restored to the first preset voltage $V_{GH}$ due to a load, e.g., as a restoration time t shown in FIG. 3. A length of the restoration time t would affect a charging time of a liquid crystal display panel, and especially in a product for displaying pictures with a high frame rate, the length of the restoration time t is extremely important since a charging time of a driving thin film transistor is significant insufficient per se.

In conclusion, there is greatly desired an apparatus for supplying gate driving voltages and a method for supplying the gate driving voltages capable of shortening a time taken by the gate ON voltage to be restored to the first preset voltage $V_{GH}$ from the second preset voltage $V_{GB}'$.

SUMMARY

The present disclosure provides an apparatus for supplying gate driving voltages which is capable of shortening a time taken by the gate ON voltage to be restored to the first preset voltage $V_{GH}$ from the second preset voltage $V_{GH}'$, so that the charging time of the liquid crystal display panel is prevented from being affected, a response speed is quicken and a display quality of the picture is enhanced. Furthermore, the present disclosure provides a method for supplying the gate driving voltages and a display apparatus to which the apparatus for supplying the gate driving voltages is applied.

Solutions utilized in embodiments of the present disclosure are as follows.

An apparatus for supplying gate driving voltages, comprising:
a starting voltage output module configured to output a gate ON voltage to a gate driving integrated circuit; the gate ON voltage comprises a first preset voltage and a second preset voltage being lower than the first preset voltage;
further comprising:
a starting voltage boost module, connected with the starting voltage output module, configured to boost the second preset voltage to a third preset voltage higher than the first preset voltage within a predetermined period of time when the second preset voltage is to be restored to the first preset voltage.

Optionally, the starting voltage boost module comprises a voltage regulating unit and a switch unit;
the voltage regulating unit is connected with the starting voltage output module and is configured to boost the second preset voltage to the third preset voltage; and
the switch unit is connected with the voltage regulating unit and is configured to turn on or turn off the voltage regulating unit at regular time.

Optionally, the starting voltage output module comprises a charge pump circuit; the charge pump circuit comprises a charge pump, a charge pump adjuster and a reference voltage terminal;
an output terminal of the charge pump is connected with the gate driving integrated circuit and is also connected with the reference voltage terminal via a voltage-dividing resistor;
the reference voltage terminal is further connected with the voltage regulating unit, and is configured to provide a reference voltage; and
the charge pump adjuster is connected with an input terminal of the charge pump, and is configured to control the charge pump to output the gate ON voltage according to the reference voltage and the voltage boosted by the voltage regulating unit.

Optionally, the voltage regulating unit comprises a protective resister and a boost resister connected at the reference voltage terminal in parallel, and the switch unit is disposed on a path between the boost resister and the reference voltage terminal.

Optionally, the voltage regulating unit comprises a protective resister and a boost resister connected at the reference voltage terminal in series, and the switch unit is connected with the boost resister in parallel.

Optionally, the switch unit comprises a switch element and a timing controller connected with the switch element.

Optionally, the switch element is a thin film transistor.

Optionally, the gate driving integrated circuit is a Multi-Level Gate driving integrated circuit.

The embodiments of the present disclosure further provide a method for supplying gate driving voltages, comprising steps of:
outputting a gate ON voltage to a gate driving integrated circuit, wherein the gate ON voltage comprises a first preset voltage and a second preset voltage being lower than the first preset voltage; boosting the second preset voltage to a third preset voltage higher than the first preset voltage within a predetermined period of time when the second preset voltage is to be restored to the first preset voltage.

Optionally, when the second preset voltage is restored to the first preset voltage, a voltage regulating unit is controlled to boost the second preset voltage to the third preset voltage and maintain the same for a predetermined period of time by a control signal applied by a timing controller.

The embodiments of the present disclosure further provide a display apparatus comprising any one of the apparatus for supplying gate driving voltages described above.

By disposing the starting voltage boost module connected with the starting voltage output module, the apparatus for supplying gate driving voltages according to the embodiments of the present disclosure boosts the second preset voltage to the third preset voltage higher than the first preset voltage in advance within the predetermined period of time by the starting voltage boost module when the second preset voltage is restored to the first preset voltage, shortens the time taken by the gate ON voltage to be restored to the first preset voltage from the second preset voltage by means of the third preset voltage with a higher voltage; therefore, the response speed is quicken and a problem of too slow restoration due to a large load is settled, so that the charging time of the liquid crystal display panel is increased and the display quality of the picture is enhanced.

DETAILED DESCRIPTION

Detailed implementations of the present disclosure would be further described below in connection with drawings and embodiments. Following embodiments are only used to explain the present disclosure but not to limit a scope of the present disclosure.

Figure 1:
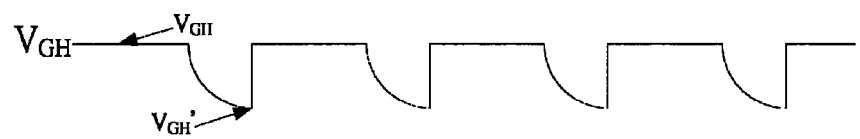
FIG. 1 is an exemplary waveform diagram of a gate ON voltage as known.
Figure 2:
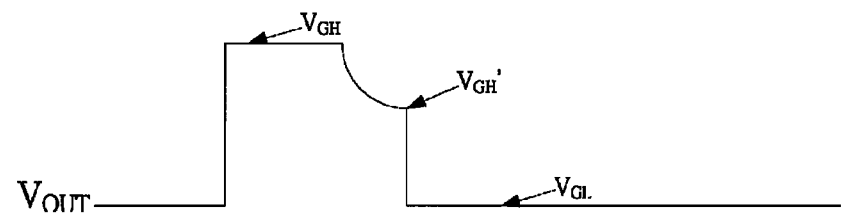
FIG. 2 is an exemplary view illustrating a output waveform of a gate driving integrated circuit as known.
Figure 3:
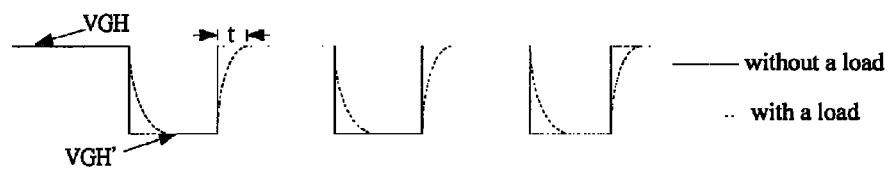
FIG. 3 is an exemplary view illustrating a waveform when a second preset voltage is restored to a first preset voltage as known.
Figure 4:
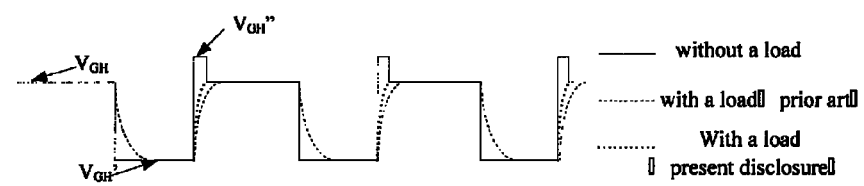
FIG. 4 is an exemplary view illustrating a waveform when the second preset voltage is restored to the first preset voltage according to embodiments of the present disclosure.

An apparatus for supplying gate driving voltages according to the embodiments of the present disclosure mainly comprises: a starting voltage output module and a starting voltage boost module connected with the starting voltage output module; the starting voltage output module is configured to output a gate ON voltage $V_{ON}$ to a gate driving integrated circuit, and the gate driving integrated circuit utilizes a multi level gate driving integrated circuit in order to reduce picture flickers; the gate ON voltage $V_{ON}$ comprises a first preset voltage $V_{GH}$ with a modulated chamfered angle and a second preset voltage $V_{GH}'$ lower than the first preset voltage $V_{GH}$. As illustrated in FIG. 3, as known, when the gate ON voltage $V_{ON}$ is to be restored to the first preset voltage $V_{GH}$ from the second preset voltage $V_{GH'}$, there would be a certain restoration time t if a load exists, and this time is generally so long that a charge time of a liquid crystal display panel is affected. One main improvement of the present disclosure is in that: the disposed starting voltage boost module boosts the second preset voltage $V_{GH}'$ to a third preset voltage $V_{GH}''$ higher than the first preset voltage $V_{GH}$ in advance within a predetermined period of time when the second preset voltage $V_{GH}'$ is to be restored to the first preset voltage $V_{GH}$, wherein the third preset voltage $V_{GH}''$ drops to the first preset voltage $V_{GH}$ after a predetermined period of time lapses; an amplitude and duration of the third preset voltage $V_{GH}''$ are designed on the basis of the actual requirements so as to achieve an optimum effect. For example, the duration may be shorten properly if the third preset voltage $V_{GH}''$ is great. As illustrated in FIG. 4, the third preset voltage $V_{GH}''$ with a higher voltage may shorten the time taken by the gate ON voltage to be restored to the first preset voltage $V_{GH}$ from the second preset voltage. $V_{GH}'$. It can be seen that, the effect is very notable in a case that the load exists, which can greatly shorten the time taken by the gate ON voltage to be restored to the first preset voltage $V_{GH}$ from the second preset voltage $V_{GE}'$.

Figure 5:
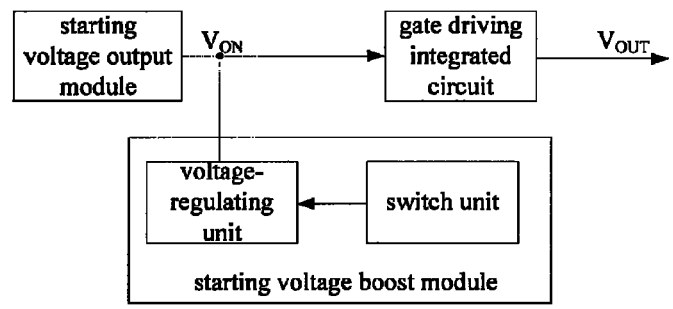
FIG. 5 is an exemplary view illustrating a configuration of an apparatus for supplying gate driving voltages according to the embodiments of the present disclosure.

As illustrated in FIG. 5, the starting voltage boost module in the present embodiment comprises a voltage regulating unit and a switch unit; the voltage regulating unit is connected with the starting voltage output module and is configured to boost the second preset voltage $V_{GH}'$ to the third preset voltage $V_{GH}''$ higher than the first preset voltage $V_{GH}$; and the switch unit is connected with the voltage regulating unit and is configured to turn on or turn off the voltage regulating unit at a regular time, so that the third preset voltage $V_{GH}''$ is maintained for the predetermined period of time, and the voltage regulating unit is turned off after the predetermined period of time, then the gate ON voltage $V_{ON}$ is still at the first preset voltage $V_{GH}$.

Since a charge pump stores energy with a capacitor and has fewer components connected externally, it is very suitable for a portable device; and it is also applicable to an application circuit requiring a large current as its circuit structure is improved and its process level is enhanced continually. Therefore, a charge pump circuit with a high efficiency has been applied in a power management circuit widely due to its advantages of low power consumption, low cost, simply structure, fewer peripheral components and high suppression for electromagnetic interference and the like.

Figure 6:
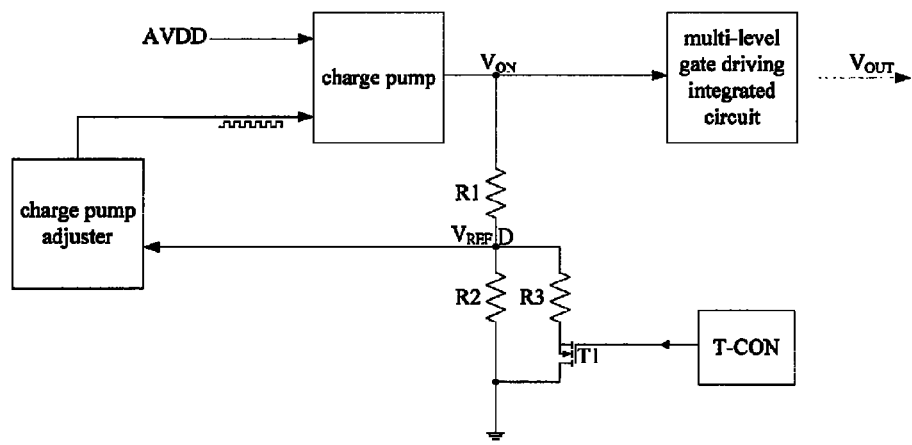
FIG. 6 is an exemplary view illustrating a structure of a detailed implementation of the apparatus for supplying gate driving voltages in FIG. 5.

As illustrated in FIG. 6, the starting voltage output module of the present disclosure comprises a charge pump circuit configured to generate the gate ON voltage $V_{ON}$. The charge pump circuit comprises a charge pump, a charge pump adjuster, a voltage-dividing resistor R1 and a reference voltage terminal D; an input terminal of the charge pump is connected with an AVDD terminal providing an original power supply, an output terminal of the charge pump is connected with the gate driving integrated circuit and is also connected with the reference voltage terminal D via the voltage-dividing resistor R1; the reference voltage terminal D is further connected with the voltage regulating unit, and is configured to provide a reference voltage $V_{REF}$; and the charge pump adjuster is disposed in a power management unit (not shown), and is connected with the input terminal of the charge pump, and is configured to control the gate ON voltage $V_{ON}$ outputted from the charge pump according to the reference voltage $V_{REF}$ and the voltage boosted by the voltage regulating unit. The voltage regulating unit may be embodied in many implementations. For example, as illustrated in FIG. 6, the voltage regulating unit comprises a protective resister R2 and a boost resister R3 connected in parallel at the reference voltage terminal D, and the switch unit is disposed on a path between the boost resister R3 and the reference voltage terminal D. The gate ON voltage $V_{ON}$ is fed back to the power management unit via the voltage-dividing resistor R1 after it is outputted from the charge pump circuit, a feedback output terminal (not shown) of the power management unit provides the fixed reference voltage $V_{REF}$ (normally, 1.25 V) to the reference voltage terminal D; then a pulse width outputted is adjusted by the charge pump adjuster in the power management unit, and in turn the output of the gate ON voltage $V_{ON}$ is stabilized. The voltage $V_{ON}$ can be calculated as follows.

When the switch unit is turned on:

$$V_{ON}=V_{REF}\times(1+R1/(R2//R3)).$$

When the switch unit is turned off:

$$V_{ON}=V_{REF}\times(1+R1/R2).$$

The outputted gate ON voltage $V_{ON}$ when the switch unit is turned on may be greater than that the outputted gate ON voltage $V_{ON}$ when the switch unit is turned off, since (R2//R3))<R2.

Herein (R2//R3) represents a resistance when the R2 and R3 are connected in parallel, and the resistance of the (R2//R3) is equal to R2×R3/(R2+R3).

Alternatively, the voltage regulating unit comprises a protective resister R2' and a boost resister R3' connected in series at the reference voltage terminal D, and the switch unit is connected with the boost resister R3' in parallel. The voltage $V_{ON}$ can be calculated as follows.

When the switch unit is turned off:

$$V_{ON}=V_{REF}\times(1+R1/(R2'+R3')).$$

When the switch unit is turned on:

$$V_{ON}=V_{REF}\times(1+R1/R2').$$

The outputted voltage of the gate ON voltage $V_{ON}$ when the switch unit is turned off may be lower than that the outputted gate ON voltage $V_{ON}$ when the switch unit is turned on, since (R2'+R3')>R2'.

As such, the switch unit may be turned on for the predetermined period of time at regular time, and the second preset voltage $V_{GH}'$ may be boosted to the third preset voltage $V_{GH}''$ higher than the first preset voltage $V_{GH}$ within the predetermined period of time.

For facilitating the control, the switch unit of the present embodiment comprises a switch element T1 and a timing controller T-CON connected with the switch element T1. Optionally, the switch element is a thin film transistor, and may be an N-type thin film transistor or a P-type thin film transistor, or may be a switch with other type.

The embodiments of the present disclosure further provide a method for supplying gate driving voltages, and as compared with the known method, one of its main improvements is in that: the second preset voltage $V_{GH}'$ is boosted to the third preset voltage $V_{GH}''$ higher than the first preset voltage $V_{GH}$ within the predetermined period of time when the second preset voltage $V_{GH}'$ is to be restored to the first preset voltage $V_{GH}$, and the third preset voltage $V_{GH}''$ drops to the first preset voltage $V_{GH}$ after the predetermined period of time lapses. The method for supplying the gate driving voltages will be described in detail below in connection with the above apparatus for supplying the gate driving voltages and FIG. 7.

In an example, when the second preset voltage $V_{GH}'$ is restored to the first preset voltage $V_{GH}$, a switch time of a thin film transistor T1 is controlled by a control signal OE3 applied by the timing controller T-CON, such that the voltage regulating unit is controlled to boost the second preset voltage $V_{GH}'$ to the third preset voltage $V_{GH}''$ and maintain the latter for the predetermined period of time; therefore, the time taken by the gate ON voltage to be restored to the first preset voltage $V_{VGH}$ from the second preset voltage $_{VGH'}$ can be shortened by means of the third preset voltage $V_{GH}''$ with a higher voltage.

Figure 7:
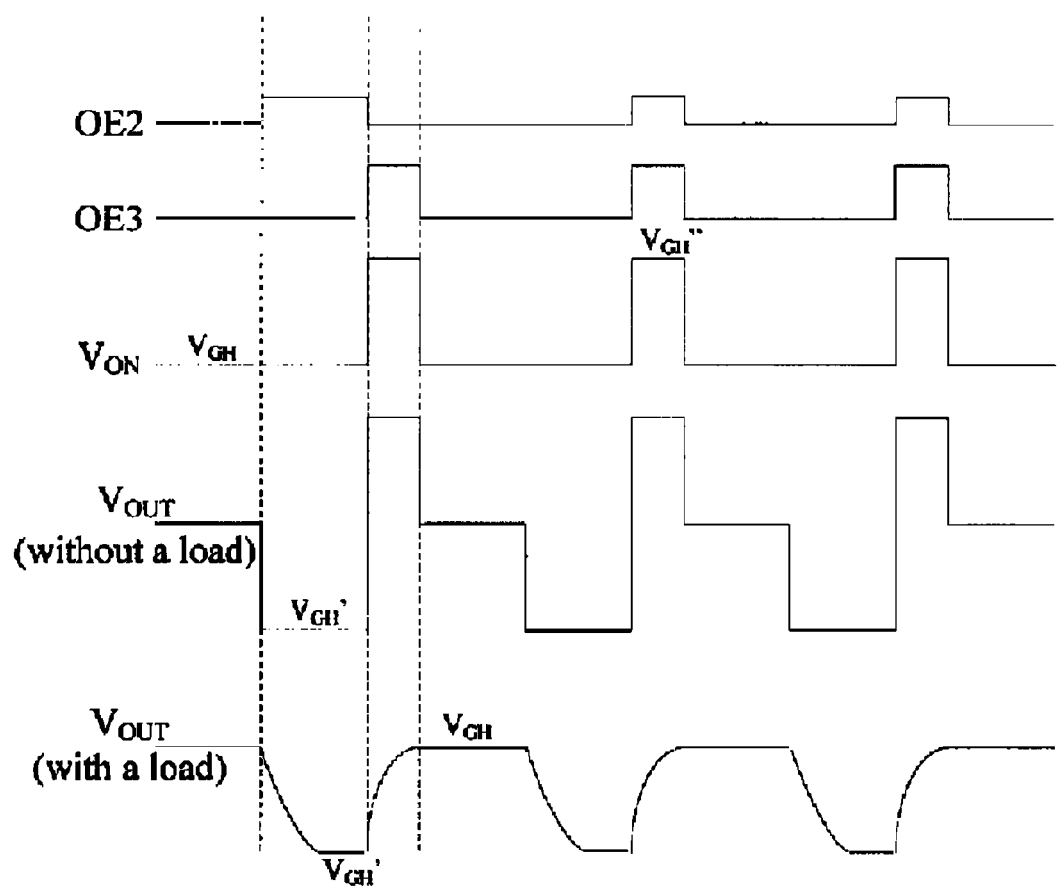
FIG. 7 is an exemplary view illustrating a control timing of a method for supplying gate driving voltages according to the embodiments of the present disclosure.

Thereafter, the gate ON voltage $V_{ON}$ is inputted into the multi level gate driving integrated circuit, and the multi level gate driving integrated circuit may further receive two inputs, one is the second preset voltage $V_{GH}'$ configured to set a voltage to which the output to be reduced, and the other is a control signal OE2 applied by the timing controller T-CON which is configured to control a timing at which a voltage to be reduced to the second preset voltage $V_{GH}'$. Thus, the required gate output voltage $V_{OUT}$ may be generated, and the exemplary corresponding waveforms of the gate output voltage $V_{OUT}$ are as shown in FIG. 7.

The embodiments of the present disclosure further provide a display apparatus comprising the apparatus for supplying gate driving voltages described above. Since the applied apparatus for supplying gate driving voltages shortens the time taken by the gate ON voltage $V_{ON}$ to be restored to the first preset voltage $V_{GH}$ from the second preset voltage $V_{GH}'$, the response speed is quicken and a problem of too slow restoration due to a large load is settled, so that the charging time of the liquid crystal display panel is increased and the display quality of the picture is enhanced. This is especially notable in a product for displaying pictures with a high frame rate.

It may understand that above embodiments are only illustrative implementations utilized for explaining the principle of the present disclosure; however, the present disclosure is not limited thereto. For those ordinary skilled in the art, many variations or improvements may be made without departing from the spirit and essence of the present disclosure, and all equivalent solutions also fall into the protection scope of the present disclosure.

What is claimed is:

1. An apparatus for supplying gate driving voltages, comprising:

a starting voltage output circuit having an output terminal connected to a reference voltage terminal via a voltage-dividing resistor; wherein the gate ON voltage comprises a first preset voltage and a second preset voltage being lower than the first preset voltage, and a gate ON voltage is outputted from the starting voltage output circuit to a gate driving integrated circuit; and a starting voltage boost circuit connected with the starting voltage output circuit, wherein the second preset voltage is boosted by the starting voltage boost circuit to a third preset voltage higher than the first preset voltage within a predetermined period of time when the second preset voltage is to be restored to the first preset voltage;

wherein the starting voltage boost circuit comprises a voltage regulating unit and a switch unit; the voltage regulating unit is connected to the reference voltage terminal, and the switch unit is connected to the voltage regulating unit; wherein a ratio of a resistance of the voltage regulating unit to that of the voltage-dividing resistor is controlled by the switch unit so as to boost the gate ON voltage to the third preset voltage higher than the first preset voltage;

wherein a fixed reference voltage is supplied from the reference voltage terminal;

wherein the voltage regulating unit comprises a protective resister and a boost resister;

the protective resister has a first terminal directly connected to the reference voltage terminal, and a second terminal directly grounded; and the boost resister has a first terminal directly connected to the reference voltage terminal, and a second terminal grounded via the switch unit.

2. The apparatus for supplying gate driving voltages of claim 1, wherein the voltage regulating unit is connected with the starting voltage output circuit, wherein the second preset voltage is boosted to the third preset voltage by the voltage regulating unit; and the voltage regulating unit is turned on or off by the switch unit at regular time.

3. The apparatus for supplying gate driving voltages of claim 2, wherein the starting voltage output circuit comprises a charge pump circuit; the charge pump circuit comprises a charge pump and a charge pump adjuster;

an output terminal of the charge pump is connected with the gate driving integrated circuit and is further connected with the reference voltage terminal via the voltage-dividing resistor; and the charge pump adjuster is connected with an input terminal of the charge pump, where the charge pump is controlled by the charge pump adjuster to output the gate ON voltage according to the reference voltage and the voltage boosted by the voltage regulating unit.

4. The apparatus for supplying gate driving voltages of claim 2, wherein the switch unit comprises a switch element and a timing controller connected with the switch element.

5. The apparatus for supplying gate driving voltages of claim 4, wherein the switch element is a thin film transistor.

6. The apparatus for supplying gate driving voltages of claim 1, wherein the gate driving integrated circuit is a Multi Level Gate driving integrated circuit.

7. A display apparatus comprising the apparatus for supplying gate driving voltages according to claim 1.

8. The display apparatus of claim 7, wherein the voltage regulating unit is connected with the starting voltage output circuit, and the second preset voltage is boosted by the voltage regulating unit to the third preset voltage; and the voltage regulating unit is turned on or off by the switch unit at regular time.

9. The display apparatus of claim 8, wherein the starting voltage output module circuit comprises a charge pump circuit; the charge pump circuit comprises a charge pump and a charge pump adjuster;

an output terminal of the charge pump is connected with the gate driving integrated circuit and is further connected with the reference voltage terminal via a voltage-dividing resistor; and the charge pump adjuster is connected with an input terminal of the charge pump, and the charge pump is controlled by the charge pump adjuster to output the gate ON voltage according to the reference voltage and the voltage boosted by the voltage regulating unit.

10. The display apparatus of claim 9, wherein the voltage regulating unit comprises a protective resister and a boost resister connected at the reference voltage terminal in parallel, and the switch unit is disposed on a path between the boost resister and the reference voltage terminal.

11. The display apparatus of claim 9, wherein the voltage regulating unit comprises a protective resister and a boost resister connected at the reference voltage terminal in series, and the switch unit is connected with the boost resister in parallel.

12. The display apparatus of claim 8, wherein the switch unit comprises a switch element and a timing controller connected with the switch element.

13. The display apparatus of claim 12, wherein the switch element is a thin film transistor.

14. The display apparatus of claim 7, wherein the gate driving integrated circuit is a Multi Level Gate driving integrated circuit.

15. A method for supplying gate driving voltages, comprising steps of:

outputting a gate ON voltage to a gate driving integrated circuit, wherein the gate ON voltage comprises a first preset voltage and a second preset voltage being lower than the first preset voltage; wherein, the second preset voltage is boosted to a third preset voltage higher than the first preset voltage within a predetermined period of time when the second preset voltage is to be restored to the first preset voltage;

wherein the output gate ON voltage is fed back to a reference voltage terminal via a voltage-dividing resistor, and a ratio of a resistance of the voltage regulating unit, which is connected to the reference voltage terminal, to that of the voltage-dividing resistor is controlled by a switch unit so as to boost the gate ON voltage to the third preset voltage higher than the first preset voltage;

wherein a fixed reference voltage is supplied from the reference voltage terminal, wherein the voltage regulating unit comprises a protective resister and a boost resister;

the protective resister has a first terminal directly connected to the reference voltage terminal, and a second terminal directly grounded; and the boost resister has a first terminal directly connected to the reference voltage terminal, and a second terminal grounded via the switch unit.

16. The method of claim 15, wherein when the second preset voltage is restored to the first preset voltage, a voltage regulating unit is controlled to boost the second preset voltage to the third preset voltage and maintain the same for a predetermined period of time by a control signal applied by a timing controller.

* * * * *